(12) United States Patent
Ihle et al.

(10) Patent No.: US 9,909,946 B2
(45) Date of Patent: Mar. 6, 2018

(54) PRESSURE SENSOR SYSTEM

(71) Applicant: EPCOS AG, Munich (DE)

(72) Inventors: Jan Ihle, Grambach (AT); Andreas Peschka, Michendorf (DE); Bert Hundertmark, Berlin (DE); Benjamin Bohl, Berlin (DE); Bernhard Ostrick, Teltow (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 15/379,018

(22) Filed: Dec. 14, 2016

(65) Prior Publication Data

US 2017/0089796 A1    Mar. 30, 2017

Related U.S. Application Data

(63) Continuation of application No. 14/767,044, filed as application No. PCT/EP2014/051031 on Jan. 20, 2014, now abandoned.

(30) Foreign Application Priority Data

Feb. 21, 2013    (DE) .................. 10 2013 101 731

(51) Int. Cl.
*G01L 19/14* (2006.01)
*G01L 19/06* (2006.01)
(Continued)

(52) U.S. Cl.
CPC .......... *G01L 19/141* (2013.01); *C04B 35/185* (2013.01); *C04B 35/626* (2013.01);
(Continued)

(58) Field of Classification Search
CPC . G01L 19/0038; G01L 19/0084; G01L 19/04; G01L 19/0627; G01L 19/0681;
(Continued)

(56) References Cited

U.S. PATENT DOCUMENTS 4,314,225 A    2/1982 Tominaga et al.
5,125,275 A    6/1992 Wilda et al.
(Continued)

FOREIGN PATENT DOCUMENTS

CN    1066124 A    11/1992
CN    1790683 A    6/2006
(Continued)

OTHER PUBLICATIONS

Kyocera, "Fine Ceramics (Advanced Ceramics)," Ceramic Product List 2012; http://global.kyocera.com/prdct/fc/list/tokusei/bouchou/index.html; downloaded Sep. 10, 2016, 4 pages.
(Continued)

*Primary Examiner* — David Bolduc
(74) *Attorney, Agent, or Firm* — Slater Matsil, LLP

(57) ABSTRACT

A pressure sensor system having a pressure sensor chip is specified. The pressure sensor chip is mounted on a mounting receptacle of a ceramic housing body having a pressure feed guided to the pressure sensor chip. The housing body is three-dimensionally shaped and monolithically formed and is formed by a ceramic material having a coefficient of thermal expansion which deviates by less than 30% from the coefficient of thermal expansion of the pressure sensor chip in a temperature range of greater than or equal to −40° C. and less than or equal to 150° C.

21 Claims, 7 Drawing Sheets

(51) Int. Cl.
*G01L 19/00* (2006.01)
*G01L 19/04* (2006.01)
*C04B 35/185* (2006.01)
*C04B 35/626* (2006.01)

(52) U.S. Cl.
CPC ...... *G01L 19/0038* (2013.01); *G01L 19/0084* (2013.01); *G01L 19/04* (2013.01); *G01L 19/0627* (2013.01); *G01L 19/0681* (2013.01); *C04B 2235/3463* (2013.01); *C04B 2235/6022* (2013.01); *C04B 2235/656* (2013.01)

(58) Field of Classification Search
CPC ... G01L 19/141; C04B 35/185; C04B 35/626; C04B 2235/3463; C04B 2235/6022; C04B 2235/656
See application file for complete search history.

(56) References Cited

U.S. PATENT DOCUMENTS

| | | | |
|---|---|---|---|
| 5,342,674 A | 8/1994 | Tanei et al. | |
| 5,477,738 A | 12/1995 | Tobita et al. | |
| 5,783,748 A | 7/1998 | Otani | |
| 6,439,058 B1 | 8/2002 | Aratani et al. | |
| 7,004,035 B2 | 2/2006 | Saito et al. | |
| 7,164,572 B1 | 1/2007 | Burdon et al. | |
| 7,300,896 B2 | 11/2007 | Zachau et al. | |
| 7,836,764 B2 | 11/2010 | Theuss et al. | |
| 7,975,553 B2 | 7/2011 | Zahout-Heil | |
| 8,230,743 B2 | 7/2012 | Wade et al. | |
| 2004/0041248 A1 | 3/2004 | Harney et al. | |
| 2005/0101161 A1 | 5/2005 | Weiblen et al. | |
| 2006/0016265 A1* | 1/2006 | Kaneko | G01L 9/0051 73/715 |
| 2006/0213276 A1* | 9/2006 | Ueyanagi | G01L 19/0084 73/754 |
| 2007/0095145 A1* | 5/2007 | Sato | G01L 19/0038 73/716 |
| 2007/0222009 A1 | 9/2007 | Kvisteroy | |
| 2008/0236278 A1 | 10/2008 | Theuss et al. | |
| 2009/0049921 A1* | 2/2009 | Otsuka | G01L 19/0069 73/706 |
| 2009/0051479 A1 | 2/2009 | Nishimura et al. | |
| 2009/0193891 A1 | 8/2009 | Ullmann et al. | |
| 2009/0266173 A1 | 10/2009 | Kobayashi et al. | |
| 2010/0199776 A1* | 8/2010 | Kang | G01L 7/082 73/716 |
| 2011/0000304 A1* | 1/2011 | Tojo | G01L 9/0042 73/754 |
| 2011/0085317 A1 | 4/2011 | Nagata et al. | |
| 2011/0265577 A1* | 11/2011 | Kunert | B60R 21/0136 73/715 |
| 2012/0077023 A1 | 3/2012 | Nagahiro et al. | |
| 2012/0112368 A1 | 5/2012 | Gorai et al. | |
| 2012/0291559 A1 | 11/2012 | Sterling et al. | |
| 2013/0123619 A1* | 5/2013 | Griggs | A61M 5/007 600/432 |
| 2013/0139603 A1* | 6/2013 | Kang | G01L 7/02 73/716 |
| 2014/0000375 A1* | 1/2014 | Miclaus | G01L 19/0609 73/706 |
| 2014/0071645 A1 | 3/2014 | Glanz et al. | |
| 2015/0377734 A1 | 12/2015 | Ihle et al. | |

FOREIGN PATENT DOCUMENTS

| | | |
|---|---|---|
| CN | 101305266 A | 11/2008 |
| CN | 102272569 A | 12/2011 |
| CN | 102401715 A | 4/2012 |
| CN | 102786025 A | 11/2012 |
| DE | 2926154 A1 | 2/1980 |
| DE | 4307600 A1 | 9/1993 |
| DE | 10049356 A1 | 5/2001 |
| DE | 10316084 A1 | 5/2004 |
| DE | 102004026210 A1 | 12/2004 |
| DE | 10348336 A1 | 5/2005 |
| DE | 102006039421 A1 | 7/2007 |
| DE | 102008015709 A1 | 11/2008 |
| DE | 102007052364 A1 | 5/2009 |
| DE | 102011003481 A1 | 8/2012 |
| EP | 1520841 | 4/2005 |
| EP | 1837303 A1 | 9/2007 |
| EP | 2136193 A2 | 12/2009 |
| GB | 2027988 A | 2/1980 |
| JP | S5524423 A | 2/1980 |
| JP | S5773980 A | 5/1982 |
| JP | S5870138 A | 4/1983 |
| JP | H06263531 A | 9/1994 |
| JP | H08233848 A | 9/1996 |
| JP | 2000162067 A | 6/2000 |
| JP | 2004101207 A | 4/2004 |
| JP | 2008089412 A | 4/2008 |
| JP | 2009031005 A | 2/2009 |
| JP | 2010210509 A | 9/2010 |
| JP | 2012047451 A | 3/2012 |
| JP | 2012150121 A | 8/2012 |
| WO | 2005042426 A2 | 5/2005 |
| WO | 2010016598 A1 | 2/2010 |
| WO | 2011104860 A1 | 9/2011 |

OTHER PUBLICATIONS

Wikipedia, "Dual in-line package," https://en.wikipedia.org/w/index.php?title=Dual_in-line_package&oldid=635910448, Nov. 29, 2014, 8 pages.

* cited by examiner

PRESSURE SENSOR SYSTEM

CROSS-REFERENCE TO RELATED APPLICATIONS

This patent application is a continuation application of U.S. patent application Ser. No. 14/767,044, filed Aug. 11, 2015, which is a national phase filing under section 371 of PCT/EP2014/051031, filed Jan. 20, 2014, which claims the priority of German patent application 10 2013 101 731.2, filed Feb. 21, 2013, each of which is incorporated herein by reference in its entirety.

TECHNICAL FIELD

A pressure sensor system having a pressure sensor chip is specified.

BACKGROUND

Continuously rising demands on pressure sensors with respect to the long-term resistance in aggressive media, the usage temperatures, and the robustness require particularly resistant sensor systems, if possible in conjunction with integrated sensor signal processing. It is simultaneously required that such systems be producible by cost-effective manufacturing and have reduced system complexity.

For easy mounting in an application, sufficient mechanical stability, and to protect the actual pressure sensor element against external influences and to prevent corrosion due to aggressive media, pressure sensor elements are typically installed in housings, which consist, for example, of plastics or of material composites of plastic, ceramic, glass, and/or metal. Solder contacts, plug contacts, and/or cable feeds are integrated in the housings for the electrical connection. Suitable seals of such systems are produced using welds, soldering, seals, potting materials, and/or adhesives.

The pressure-tight connection of a pressure sensor element to the part of the housing supplying pressure is predominantly performed according to the prior art via sealing rings or organic adhesives, for example, polyurethane resins, silicones, epoxy resins, or mixtures thereof.

Sensor systems having plastic or metal housings are only usable in aggressive media to a limited extent because of corrosion occurrences. In particular the organic adhesive bonds between the system components represent a weak point with respect to the long-term resistance. Plastic housings are additionally incompatible with alternative joining technologies, for example, welds and soldered connections. Therefore, most sensor systems in the prior art consist of material combinations, which in turn require additional connections and make the systems very complex.

SUMMARY

Embodiments of the invention specify a pressure sensor system having a pressure sensor chip in a housing.

According to at least one embodiment, a pressure sensor system is provided, in particular a ceramic encapsulated pressure sensor system.

According to at least one embodiment, a pressure sensor system comprises a pressure sensor chip, which is mounted on a mounting receptacle of a ceramic housing body. The housing body is produced from a ceramic material, which is three-dimensionally shaped and is monolithically formed. In particular, the ceramic housing body furthermore has a pressure feed, which is led to the pressure sensor chip and thus connects the pressure sensor chip to the pressure to be measured.

Three-dimensionally shaped means here and hereafter that the housing body is not formed by a flat ceramic carrier, i.e., for example, by a ceramic substrate in the form of a ceramic plate, but rather has a non-planar three-dimensional surface topography on the mounting side, on which the sensor chip is mounted. In particular, the ceramic body has, on the side on which the pressure sensor chip is applied, i.e., on the side having the mounting receptacle, a three-dimensional surface structure in which, for example, the mounting receptacle is formed as a protrusion or depression in a mounting area. Monolithically formed means here and hereafter that the housing body is not produced from a composite of multiple prefinished ceramic parts, but rather is formed by a single integrally formed ceramic body, which is adapted in its three-dimensional shape to the requirements of the pressure sensor system. This can also mean in particular that the housing body is not only formed with a mounting receptacle for the pressure sensor chip and with a pressure feed, but rather also with one or more further mounting receptacles for further pressure sensor chips and/or for other electronic components, for example, signal processing chips and/or with mechanical fastening parts, for example, protrusions or depressions in the form of catch lugs or anchoring structures.

In particular, the housing body is the part of the pressure sensor system on which the pressure sensor chip and optionally further electronic components, for example, a signal processing electronics system are mounted. Mounted means here and hereafter that the pressure sensor chip and optionally further electronic components are fastened directly, that is to say in each case by means of a connection material, to corresponding mounting receptacles, which are provided for this purpose, of the housing body. The housing body can furthermore be the only part and in particular the only ceramic part of the pressure sensor system on which the electronic and electrical components, i.e., for example, chips, circuit, and electrical connections, are mounted or applied.

The ceramic housing body forms a ceramic packaging or a ceramic encapsulation for the pressure sensor chip, so that the pressure sensor system described here can also be usable in particular in the case of high application temperatures and in particularly aggressive media and gases.

With the aid of the ceramic injection-molding technology, which is described in greater detail hereafter, for producing the housing body, very complex ceramic housing structural forms, which are adapted to customer specific requirements, can also be produced precisely and reproducibly with a high mechanical strength. Because the housing body can be formed monolithically with its three-dimensional shape, the complexity of the pressure sensor system can furthermore be reduced. The reduction of the system complexity as a result of the monolithic embodiment of the housing body, in particular also by way of a unification of multiple system components in a single part, which typically must be joined together to form a composite in the prior art, additionally also results in material and cost savings.

According to a further embodiment, the ceramic material of the housing body has a coefficient of thermal expansion which deviates by less than 30% from the coefficient of thermal expansion of the pressure sensor chip in a temperature range of greater than or equal to −40° C. and less than or equal to 150° C. In other words, the coefficient of thermal expansion of the ceramic housing body is adapted to the coefficient of thermal expansion of the pressure sensor chip.

In particular, the coefficients of thermal expansion of the housing body and of the pressure sensor chip can also be adapted to one another and deviate by less than 30% from one another in a temperature range of greater than or equal to −50° C. and less than or equal to 200° C. The smaller the difference between the coefficients of thermal expansion of the housing body and of the pressure sensor chip, the smaller thermomechanical tensions can occur in the pressure sensor system between the pressure sensor chip and the ceramic housing body. It can therefore be particularly advantageous if the coefficients of thermal expansion deviate by less than 20% and preferably by less than 10% from one another in one of the mentioned temperature ranges.

The pressure sensor system described here is therefore distinguished in particular in that the coefficient of thermal expansion of the housing body is adapted to the coefficient of thermal expansion of the pressure sensor chip. By way of a suitable selection of the ceramic material for the housing body forming the packaging, it is possible to reduce the thermomechanical stress occurring due to temperature changes between the pressure sensor chip and the housing body.

According to a further embodiment, the pressure sensor chip is designed as a piezo-resistive silicon pressure sensor, capacitive ceramic pressure sensor, piezo-resistive thick-film-based or thin-film-based pressure sensor based on metallic or ceramic bending plates, or as an inductive pressure sensor. In particular, the pressure sensor chip can be a silicon-based pressure sensor chip.

By way of a suitable selection of the ceramic material of the housing body having a coefficient of thermal expansion which is in the range of the material of the pressure sensor chip, i.e., for example, silicon, thermally-induced mechanical tensions, which can result in corruption of the pressure sensor signal, may advantageously be strongly reduced or even prevented entirely.

According to a further embodiment, the ceramic material comprises mullite, i.e., aluminum silicate. Furthermore, it can also be possible that the ceramic material of the housing body comprises aluminum oxide, zirconium oxide, aluminum nitride, silicon carbide, or silicon nitride. The ceramic housing body can also comprise a combination of the mentioned materials. Furthermore, the ceramic housing body can also consist of one or more of the mentioned ceramic materials. The advantage of the pressure sensor system described here is the monolithic embodiment of the housing body using a suitable ceramic material such as those mentioned above. A substantially improved media resistance is thus achievable in comparison to the prior art.

According to a further embodiment, a signal processing chip is mounted on a further mounting receptacle of the housing body. Each of the mounting receptacles of the ceramic housing body can be embodied as depressed or alternatively also as elevated. The signal processing chip can be provided for the purpose in particular and embodied such that it detects and further processes an electrical signal of the pressure sensor chip, so that a pressure measurement signal can be output via electrical connections of the pressure sensor system. The signal processing chip can be formed, for example, as an integrated circuit in the form of a single chip or also in the form of multiple electronic components, which are mounted in thick-film technology, for example. An electrical connection between the pressure sensor chip and the signal processing chip can be provided by conductor tracks on the and/or in the housing body and/or by bond wire connections.

According to a further embodiment, the housing body comprises a pressure fitting, wherein the pressure feed extends from the pressure fitting up to the pressure sensor chip. The pressure fitting can be cylindrical or conical and can furthermore be embodied with a thread, a bayonet socket part, or teeth.

A connecting material can be used for fastening and sealing the pressure sensor chip. In particular, the connecting material can enable direct mounting of the pressure sensor chip on the housing body.

According to a further embodiment, the pressure sensor chip is mounted by means of a flexible connecting material directly on the mounting receptacle of the ceramic housing body. The flexible connecting material can be formed in particular by a silicone adhesive.

According to a further preferred embodiment, the pressure sensor chip is mounted by means of a rigid connecting material directly on the mounting receptacle of the ceramic housing body. The rigid connecting material can be formed, for example, by an epoxy resin adhesive or particularly preferably by a glass solder or a metallic solder.

The connection of the pressure sensor chip to the ceramic housing body is particularly advantageously performed via a glass solder or a metal solder. Changes of the pressure signal, the mechanical connection, and the media resistance between the pressure sensor chip and the housing body, as are induced by the aging behavior of polymers, can thus be prevented. A solder connection, in particular a glass solder connection, can only be used if materials having similar coefficients of thermal expansion are used for the pressure sensor chip and the ceramic housing body, in the case of a silicon-based sensor chip, thus materials such as preferably mullite or, for example, also aluminum nitride, silicon nitride, or silicon carbide for the housing body. Thermally induced tensions in the pressure sensor chip, which could have an effect on the pressure voltage signal, may only thus be avoided with the very similar thermal coefficients of expansion thus achievable of the materials in the event of a fixed connection such as a glass solder connection.

To produce the ceramic housing body, the three-dimensional and monolithic formation can be performed by means of ceramic injection-molding technology. A housing design, which can also be adapted to the requirement depending on the application, and in particular geometries of the ceramic housing body which can be freely designed are possible using this technology, for example, for forming the integrated one or more mounting receptacles for the pressure sensor chip and optionally for the signal processing chip and optionally the pressure fitting. Different chips can be used due to the adaptable housing form having the cavities or protrusions to accommodate the pressure sensor chip and the analysis chip. Furthermore, a miniaturization of the pressure sensor system is also possible.

In the case of ceramic injection-molding technology, a ceramic raw material, a so-called ceramic feedstock, which comprises or consists of a structural-ceramic powder, advantageously mullite powder, aluminum oxide powder, zirconium oxide powder, aluminum nitride powder, silicon nitride powder, or silicon carbide powder, and an organic binder, is injected into a corresponding mold. A green body produced in this manner is subsequently substantially freed of the organic component in a debindering process, which can be two-stage (aqueous, thermal or catalytic) or one-stage (only thermal). The debindered bodies are subsequently sintered.

The advantage of ceramic injection-molded bodies is in particular the very precise embodiment of the housing dimensions, which enable simple and standardized mounting without additional system elements with, at the same time, little thermal expansion, very high mechanical and chemical robustness, and extreme long-term stability.

A ceramic body produced via ceramic injection-molding technology is sintered with a suitable temperature profile and in a suitable atmosphere to form the finished ceramic housing body, in the case of mullite, depending on the purity or sintering additive proportion, for example, at 1500° C. to 1750° C. and preferably at 1600° C. to 1750° C. in air.

According to a further embodiment, the pressure sensor system has electrical connections for electrically connecting at least the pressure sensor chip. Furthermore, the electrical connections can form the external connection of the pressure sensor system. The electrical connections can be formed on the and/or in the ceramic housing body and can comprise one or more of the following elements: conductor tracks, wiring carriers, metallic vias, bond wires.

The electrical connections can comprise or consist of conductor tracks, for example, which are applied directly to the ceramic housing body by means of metallization methods, for example, thick-film or thin-film technology. The mounting side of the housing body, on which the mounting receptacle for the pressure sensor chip is located, is advantageously regionally embodied as planar, so that conductor tracks can be deposited by means of cost-effective screen printing technology or sputter technology. A three-dimensional embodiment of the conductor tracks by means of pad printing or dispensing, for example, is also possible.

Furthermore, parts of the electrical connections can be led through the ceramic housing in the form of vias, to electrically connect conductor tracks attached to both sides to one another.

Furthermore, the electrical connections can comprise a wiring carrier or can be embodied as such or can comprise or consist of a combination of a directly applied thick-film or thin-film metallization with a wiring carrier. The wiring carrier can be externally electrically contacted via soldered connections, for example.

The wiring carrier can be a rigid or flexible printed circuit board, a lead frame, or a lead frame which is at least partially enveloped with plastic. Direct mounting of the wiring carrier on the ceramic main body can be performed, for example, by latching, pressing, or clamping in corresponding structures in the main body. Furthermore, fastening of the wiring carrier can also be performed via direct soldering, for example, soft soldering, hard soldering, glass soldering, active soldering, or gluing onto the main body and/or onto conductor tracks.

The pressure sensor chip can be electrically connected to the electrical connections and/or to a signal processing chip, for example, by means of bond wires or by direct mounting on conductor tracks.

According to a further embodiment, the pressure sensor system has a cover, which is fastened on the housing body above the pressure sensor chip. The mounting side of the housing body, i.e., the side with the pressure sensor chip, can be closed or encapsulated by the cover. The cover can comprise or be made of, for example, plastic, metal, or a ceramic material.

According to a further embodiment, a wiring carrier, which can form at least a part of the electrical connections, comprises recesses, through which parts of the housing body and/or the cover engage or grasp, to lock or fasten the wiring carrier.

According to a further embodiment, the housing body has recesses, in which corresponding parts of the cover and/or a wiring carrier, which forms at least a part of the electrical connections, engage or grasp, so that a mechanical lock is formed for fastening the cover and/or the wiring carrier.

The cover can alternatively also be glued or soldered onto the housing body.

According to a further embodiment, the pressure sensor chip and/or a signal processing chip is at least partially covered with a polymer potting. In particular, the pressure sensor chip can be electrically contacted by means of bond wire connections, which are covered with the polymer potting. The polymer potting can additionally or alternatively also cover parts of the housing body or the electrical connections. In particular, the polymer potting can form a protector of the covered parts and components in relation to the environment. For this purpose, the polymer potting can form a covering, which forms at least a part of an outer side of the pressure sensor system. Alternatively thereto, the polymer potting can also be arranged under a cover. The polymer potting can furthermore be arranged spaced apart from the cover in this case, for example. For example, the cover can have a depression in which the pressure sensor chip is arranged, wherein the polymer potting does not entirely fill up the depression of the cover in this case.

According to a further embodiment, the pressure sensor system comprises a plurality of pressure sensor chips on mounting receptacles of the ceramic housing body. Alternatively or additionally, multiple signal processing chips can also be provided.

According to a preferred embodiment, the pressure sensor system comprises the following components: at least one pressure sensor chip, a ceramic housing body, which is formed in a monolithic embodiment and which comprises at least one mounting receptacle for the at least one pressure sensor chip and a pressure feed, wherein the at least one pressure sensor chip is directly connected to the ceramic housing body. The pressure sensor system further includes electrical connections.

In further preferred embodiments, the pressure sensor system additionally comprises one or more of the following components: at least one signal processing chip, which is arranged on at least one mounting receptacle of the housing body and which is preferably directly connected to the housing body, a pressure fitting, and a cover.

BRIEF DESCRIPTION OF THE DRAWINGS

Further advantages, advantageous embodiments, and refinements result from the exemplary embodiments described hereafter in conjunction with the figures.

In the figures.

In the exemplary embodiments and figures, identical, equivalent, or identically acting elements can each be provided with the same reference signs. The illustrated elements and the size relationships thereof among one another are not to scale, rather individual elements, for example, layers, parts, components, and regions, can be shown exaggerated large for better illustration ability and/or for better comprehension.

DETAILED DESCRIPTION OF ILLUSTRATIVE EMBODIMENTS

Figure 1:
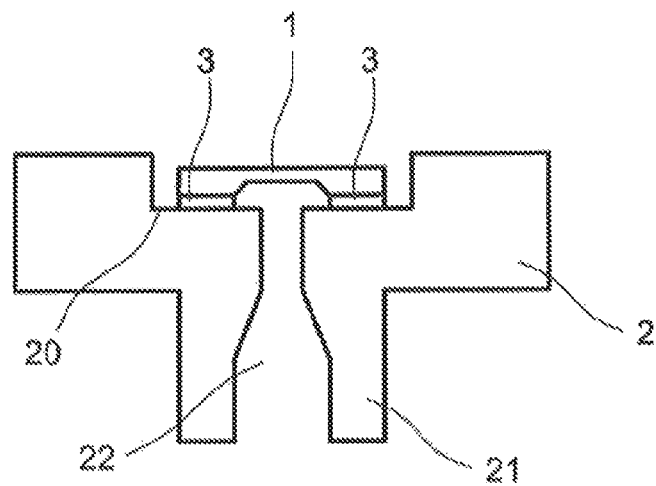
FIG. 1 shows a schematic illustration of a pressure sensor system according to an exemplary embodiment.

FIG. 1 shows a pressure sensor system according to one exemplary embodiment, which comprises a pressure sensor chip 1, which is mounted on a mounting receptacle 20 of a ceramic housing body 2. The mounting receptacle 20 is formed by a depression of the housing body 2 on a mounting side of the housing body 2. Alternatively thereto, the mounting receptacle 20 can also be formed as a protrusion instead of a depression, for example.

Furthermore, the housing body 2 has a pressure feed 22, via which the pressure to be measured can be fed to the pressure sensor chip 1. The pressure feed 22 extends for this purpose up to the mounting receptacle 20. To connect the pressure sensor system, a pressure fitting 21 can be provided, as shown in FIG. 1, which can be formed as cylindrical or conical and can comprise, for example, a thread, a part of a bayonet socket, or teeth.

The mounting of the pressure sensor chip 1 on the mounting receptacle 20 of the ceramic housing body 2 and the sealing of the pressure sensor chip 1 are performed simultaneously by a connecting material 3, so that the pressure sensor chip 1 is mounted directly on the housing body 2.

The pressure sensor chip 1 can be designed, for example, as a silicon-based pressure sensor chip thus, for example, a piezo-resistive silicon pressure sensor. Furthermore, the pressure sensor chip 1 can also be designed as a capacitive ceramic pressure sensor, piezo-resistive thick-film-based or thin-film-based pressure sensor based on metallic or ceramic bending plates, or as an inductive pressure sensor.

The housing body 2 is three-dimensionally shaped and is monolithically formed. In particular, to produce the ceramic housing body 2, a green body is produced, which already comprises the shape of the final housing body 2 and can be dried and/or debindered, depending on the material, and also sintered in this form.

The production of the housing body 2 is performed by means of ceramic injection-molding technology, as described in the general part, wherein geometries which can be freely formed and, for example, a design of the integrated mounting receptacle 20 specifically for the pressure sensor chip 1 is possible. The shape of the housing body 2 according to the illustration in FIG. 1 is to be understood solely as an example and can comprise further geometric features and surface structures or shapes, which can be provided, for example, to accommodate further electronic parts, electrical contacts, a cover, or to mount the pressure sensor system.

If mullite is used, for example, as the ceramic material for the ceramic housing body 2, the green body produced by means of injection-molding technology can be sintered, depending on the purity and the sintering additive fraction, for example, in a temperature range of 1500° C. to 1750° C. in air.

In particular, the ceramic housing body 2 comprises a ceramic material, which has a coefficient of thermal expansion which is adapted to the coefficient of thermal expansion of the pressure sensor chip 1. This means in particular that the coefficients of thermal expansion of the pressure sensor chip 1 and of the housing body 2 deviate from one another by less than 30%, preferably by less than 20%, and particularly preferably by less than 10%. In particular, the coefficients of expansion can be adapted to one another in a temperature range of greater than or equal to −40° C. and less than or equal to 150° C. and preferably in a temperature range of greater than or equal to −50° C. and less than or equal to 200° C. In this way, it can be ensured that in the case of typical operating temperatures of the pressure sensor system, the coefficients of thermal expansion of the pressure sensor chip 1 and of the housing body 2 deviate from one another as little as possible.

Mullite, i.e., aluminum silicate, has proven to be particularly advantageous as a ceramic material for the ceramic housing body 2. Alternatively thereto, the ceramic material of the housing body 2 can also comprise aluminum oxide, zirconium oxide, aluminum nitride, silicon carbide, or silicon nitride or can consist of one or more of the mentioned ceramic materials. By way of a suitable selection of the ceramic material having a coefficient of thermal expansion which lies in the range of the pressure sensor chip 1, i.e., for example, in the range of silicon, which can be used as the fundamental chip material of the sensor chip 1, thermally induced mechanical tensions, which could result in corruption of the pressure signal, may advantageously be significantly reduced or even prevented entirely. Due to the monolithic embodiment of the housing body 2, which represents a unification of multiple system components in a single part in comparison to the prior art, the system complexity of the pressure sensor system can be significantly reduced, which results in material and cost savings in comparison to the prior art. Furthermore, a very high level of media resistance is also possible in the case of high temperatures and very aggressive media.

Due to the adaptation of the coefficients of thermal expansion of the pressure sensor chip 1 and the housing body 2 to one another, a rigid connecting material 3, for example, an epoxy resin adhesive, a glass solder, or a metallic solder, can particularly preferably be used. Connecting the pressure sensor chip 1 to the ceramic housing body 2 by means of a glass solder or a metallic solder is particularly advantageous. In contrast to polymers, such connecting materials do not have the aging behavior typical for these polymers, whereby changes of the pressure signal and the mechanical connection can be avoided. Since the coefficients of thermal expansion of the pressure sensor chip 1 and of the housing body 2 are adapted to one another, in spite of a fixed direct connection between the pressure sensor chip 1 and the housing body 2 by way of the connecting material 3, the formation of thermally induced tensions in the sensor chip 1, which could have an effect on the pressure signal, can be avoided.

A very precise embodiment of the housing dimensions can be achieved by means of the ceramic injection-molding technology. In this way, simple and standardized mounting of the pressure sensor chip 1 without additional system elements is possible, while at the same time low thermal tension, very high mechanical and chemical robustness, and extreme long-term stability can be achieved.

In the following figures, further exemplary embodiments of pressure sensor systems are shown, which show refinements and modifications of the pressure sensor system according to the exemplary embodiment in FIG. 1. The following description is therefore primarily restricted to the differences from the previously described exemplary embodiment.

Various views of a further exemplary embodiment for a pressure sensor system are shown in conjunction with FIGS. 2A to 2G, which, in addition to the pressure sensor chip 1 on the housing body 2, comprises a signal processing chip 7 on a further mounting receptacle 20 of the ceramic housing body 2, wherein the mounting receptacles 20 for the pressure sensor chip 1 and the signal processing chip 7 are each formed by depressions. Alternatively thereto, the pressure sensor system can also comprise a plurality of pressure sensor chips 1 and/or signal processing chips 7. The pressure sensor chip 1 and the signal processing chip 7 are each mounted directly on the housing body 2 by means of a connecting material (not shown in the following figures for the sake of comprehensibility), as described in conjunction with FIG. 1 and in the general part.

Furthermore, the pressure sensor system shown in conjunction with FIGS. 2A to 2G comprises electrical connections 4, a polymer potting 5, and a cover 6.

Figure 2A:
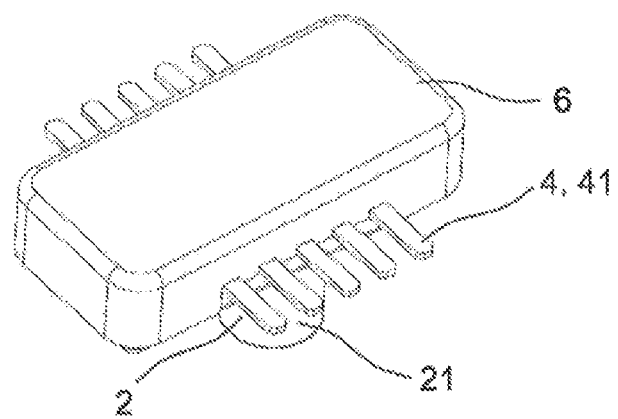
FIGS. 2A to 2G show schematic illustrations of various views of a pressure sensor system according to a further exemplary embodiment.
Figure 2B:
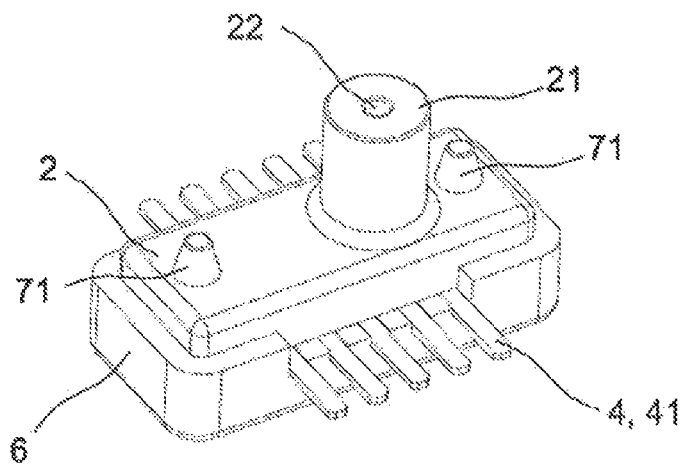
Figure 2C:
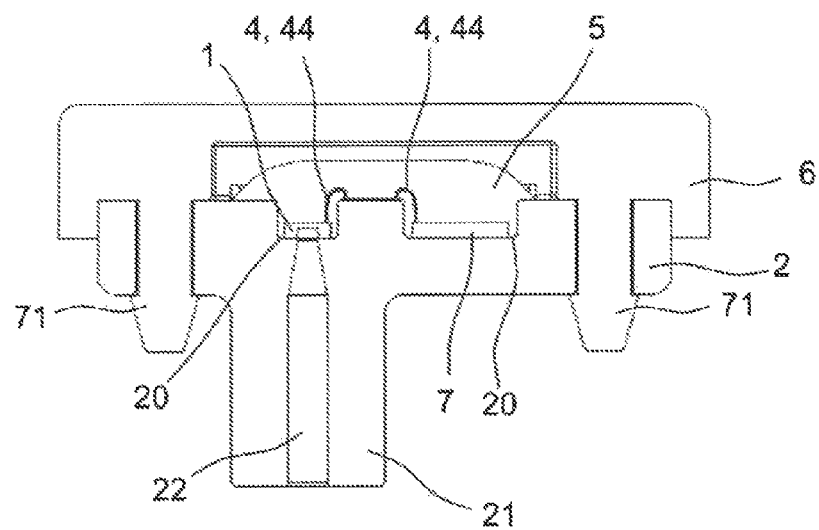
Figure 2D:
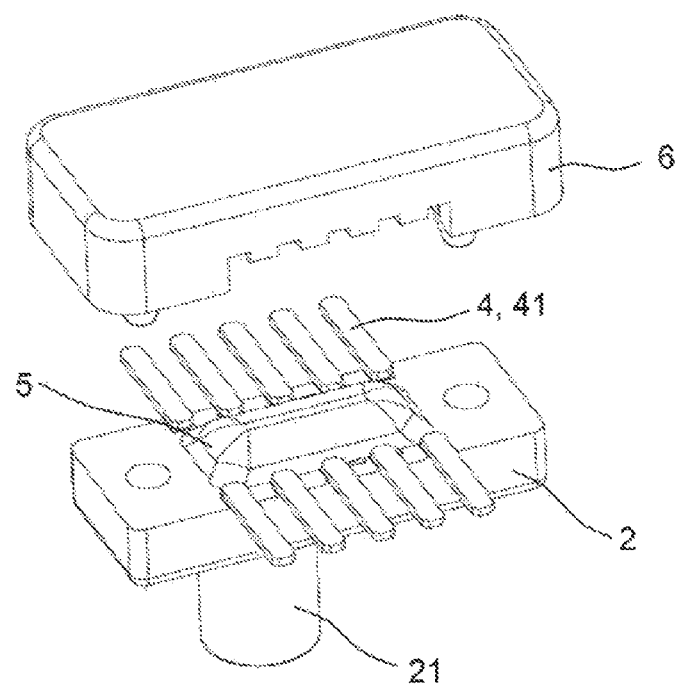
Figure 2E:
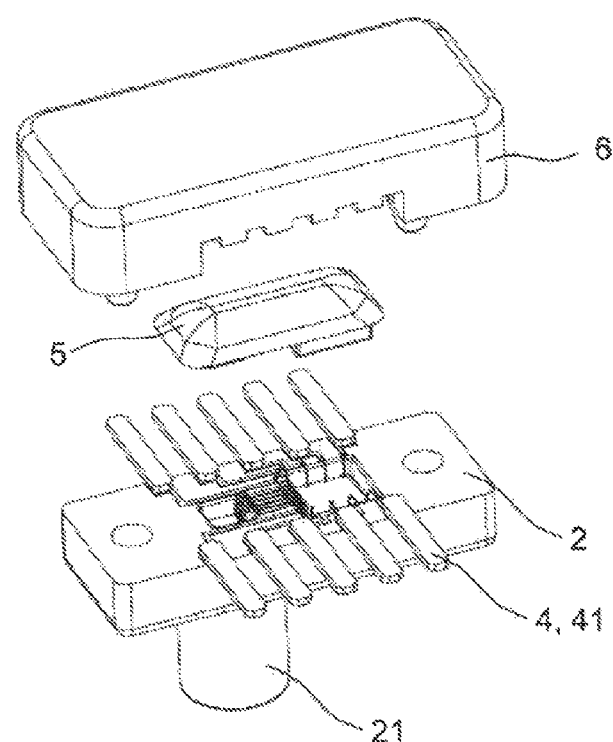
Figure 2F:
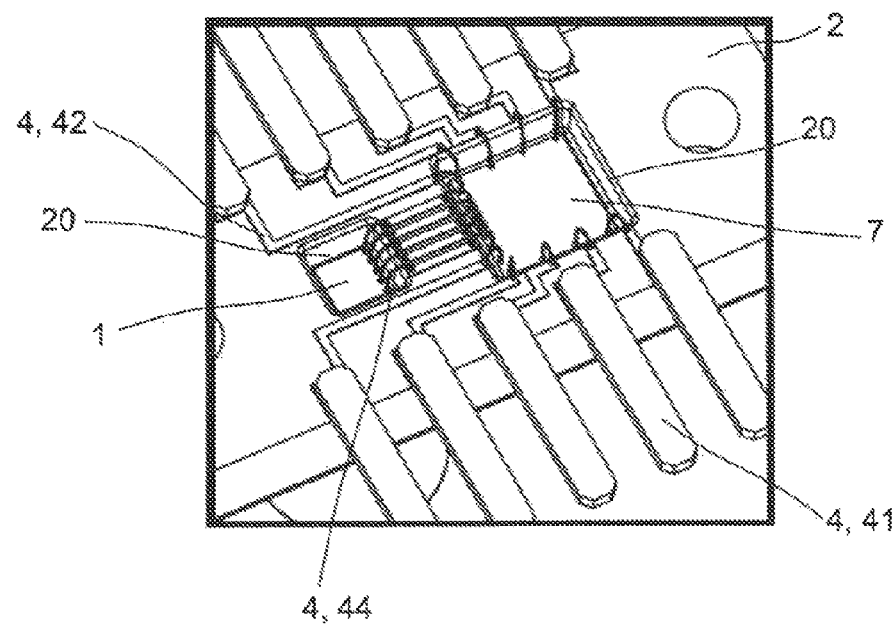
Figure 2G:
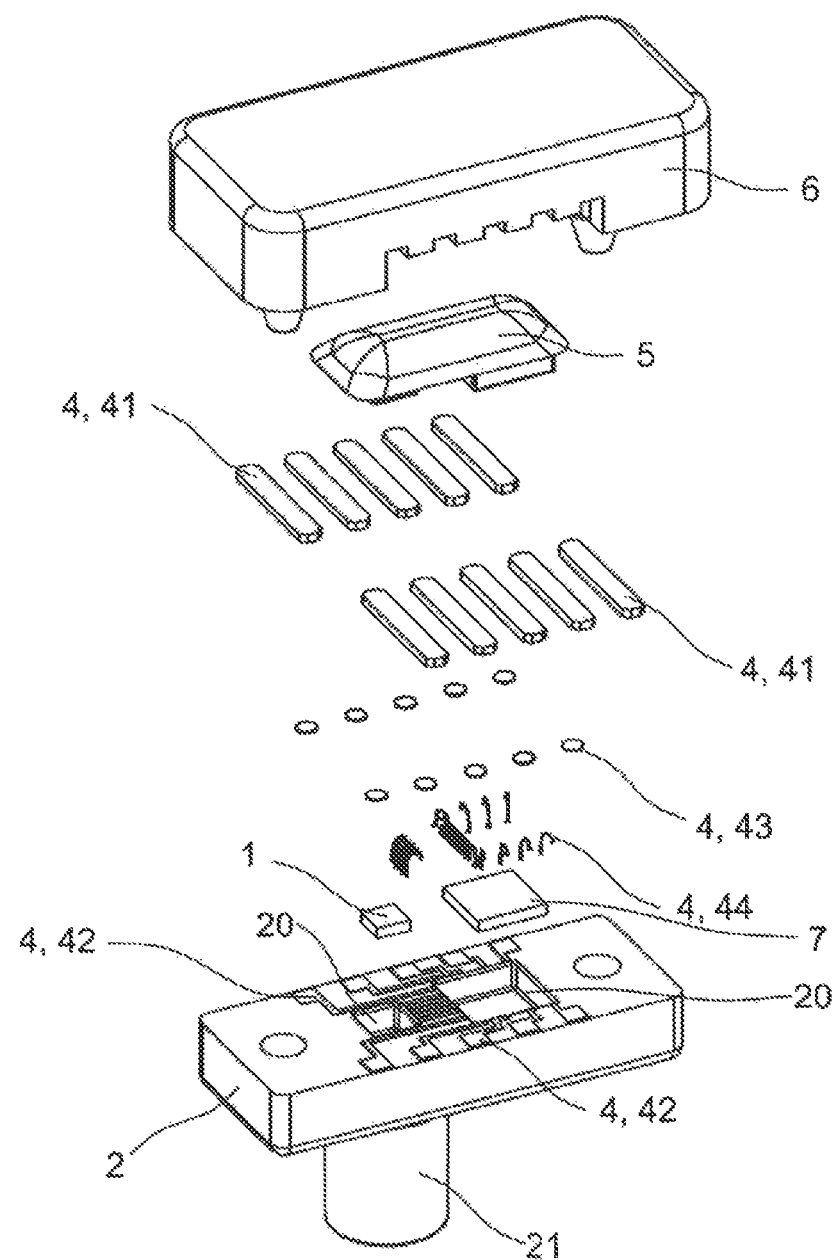

FIGS. 2A and 2B show the pressure sensor system in a state closed by means of the cover 6 from the upper side and the lower side, while FIG. 2C shows a sectional view through the pressure sensor system. In FIGS. 2D and 2E, the pressure sensor system is shown with open cover 6 for better illustration, wherein the polymer potting 5 is additionally lifted out in FIG. 2E. FIG. 2F shows a detail view of such an open pressure sensor system, while FIG. 2G shows an exploded view of the pressure sensor system.

As electrical connections 4, the pressure sensor system comprises parts of a wiring carrier 41, conductor tracks 42, soldered connections 43, and bond wires 44. The pressure sensor chip 1 can be electrically conductively connected to the signal processing chip 7 via the electrical connections 4 and an external electrical connection of the pressure sensor system can furthermore be provided.

The conductor tracks 42 can, for example, be applied to the ceramic housing body 2 by means of metallization method, for example, thick-film or thin-film technology. The mounting side of the housing body 2 is advantageously embodied as at least regionally planar for this purpose, so that the conductor tracks 42 can be deposited by means of cost-effective screen printing technology or sputtering technology. Alternatively thereto, in the case of a corresponding surface topography of the housing body 2, a three-dimensional formation of conductor tracks can also be performed by means of, for example, pad printing or dispensing.

The pressure sensor chip 1 and the signal processing chip 7 are electrically connected to conductor tracks 42 by means of the bond wires 44. For the external contacting of the pressure sensor system, the wiring carrier 41 is provided, the parts of which are soldered by means of soldered connections 43 onto corresponding contact points of the conductor tracks 42 and which protrudes out of the housing body 2 closed by means of the cover 6, so that the pressure sensor system can be electrically connected by soldering the wiring carrier 41. The wiring carrier 41 can be, for example, a rigid or flexible printed circuit board, a so-called lead frame, or a lead frame which is at least partially enveloped with plastic.

Alternatively to soldering, for example, soft soldering, hard soldering, glass soldering, or active soldering, by means of which the wiring carrier 41 can be fastened on the conductor tracks 42 and furthermore also, for example, on parts of the housing body 2, the wiring carrier 41 can also be fastened by means of gluing. Furthermore, direct mounting of the wiring carrier 41 on the ceramic housing body 2 can be performed by means of latching, pressing, or clamping in corresponding structures of the ceramic body 2. Such structures can be produced using the above-described method together with the other three-dimensional housing features of the housing body. It is also possible, for example, that the wiring carrier 41 comprises recesses, through which parts of the ceramic body 2 and/or the cover 6 grasp to lock or fasten the wiring carrier 41.

The cover 6 is used for closing the mounting side of the ceramic main body 2, on which the pressure sensor chip 1 is arranged. The cover 6 can consist, for example, of plastic, metal, or a ceramic or can comprise at least one or more of the mentioned materials. In the exemplary embodiment shown, the cover 6 is produced in particular from a plastic material. For the fastening of the cover 6 on the housing body 2, the housing body 2 has recesses, through which parts of the cover 6 grasp in the form of catch lugs or teeth, so that a mechanical lock 71 of the cover 6 on the housing body 2 is formed.

The cover 6 has a depression, which extends over the mounting side of the housing body 2. A polymer potting 5, which can be used for the protection or stabilization of the covered areas or elements, is arranged in the depression of the cover 6 at least on parts of the pressure sensor chip 1 and/or the electrical connections 4 and/or the signal processing chip 7 and/or the housing body 2. As shown in FIG. 2C, the polymer potting 5 can be arranged spaced apart from the cover 6 in this case, so that the depression of the cover 6 is not entirely filled with the polymer. In particular the bond wire connections can be covered with a polymer for the stabilization thereof.

Alternatively to the exemplary embodiment shown, the pressure sensor system can also only have a polymer potting 5 and no cover. In this case, the polymer potting 5 can form a protector of the covered parts and components in relation to the environment. For this purpose, the polymer potting 5 can form a covering, which forms at least a part of an outer side of the pressure sensor system.

Figure 3A:
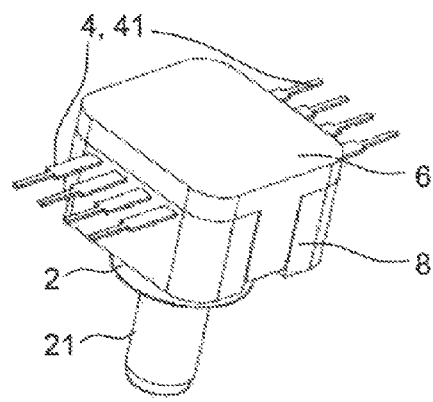
FIGS. 3A to 3F show schematic illustrations of various views of a pressure sensor system according to a further exemplary embodiment.
Figure 3B:
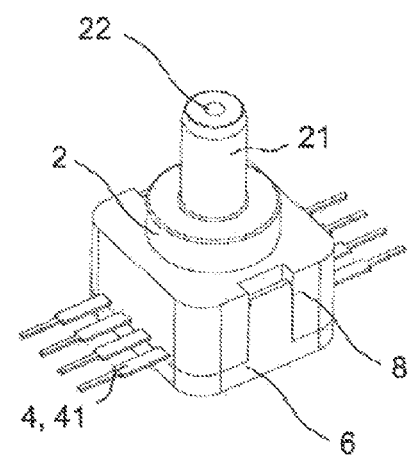
Figure 3C:
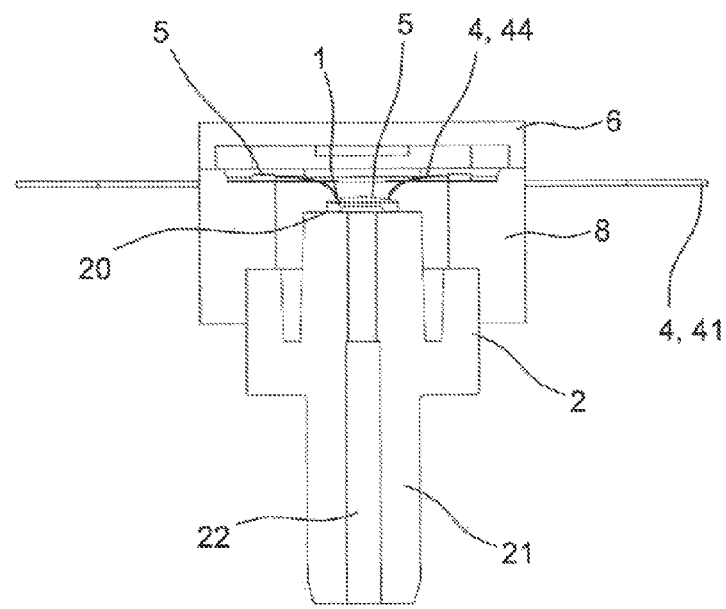
Figure 3D:
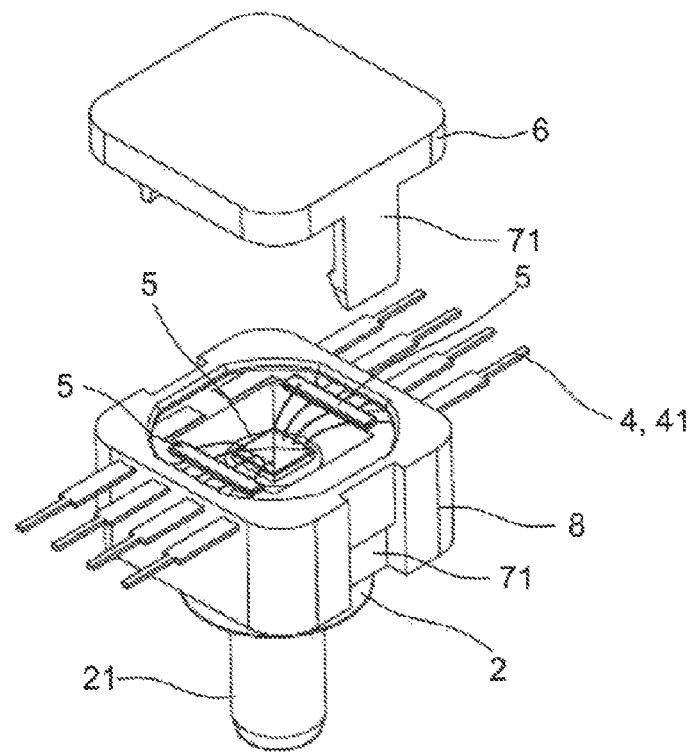
Figure 3E:
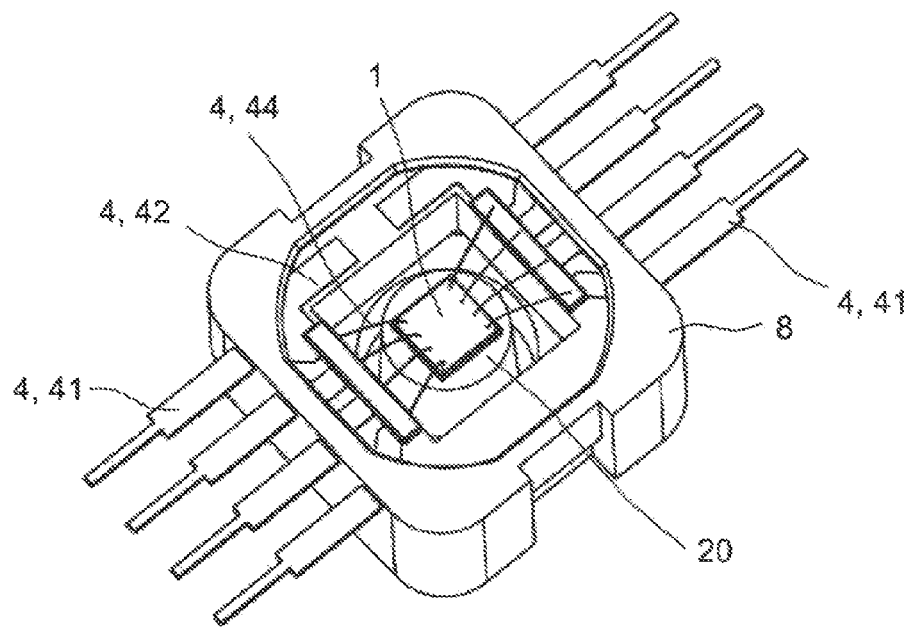
Figure 3F:
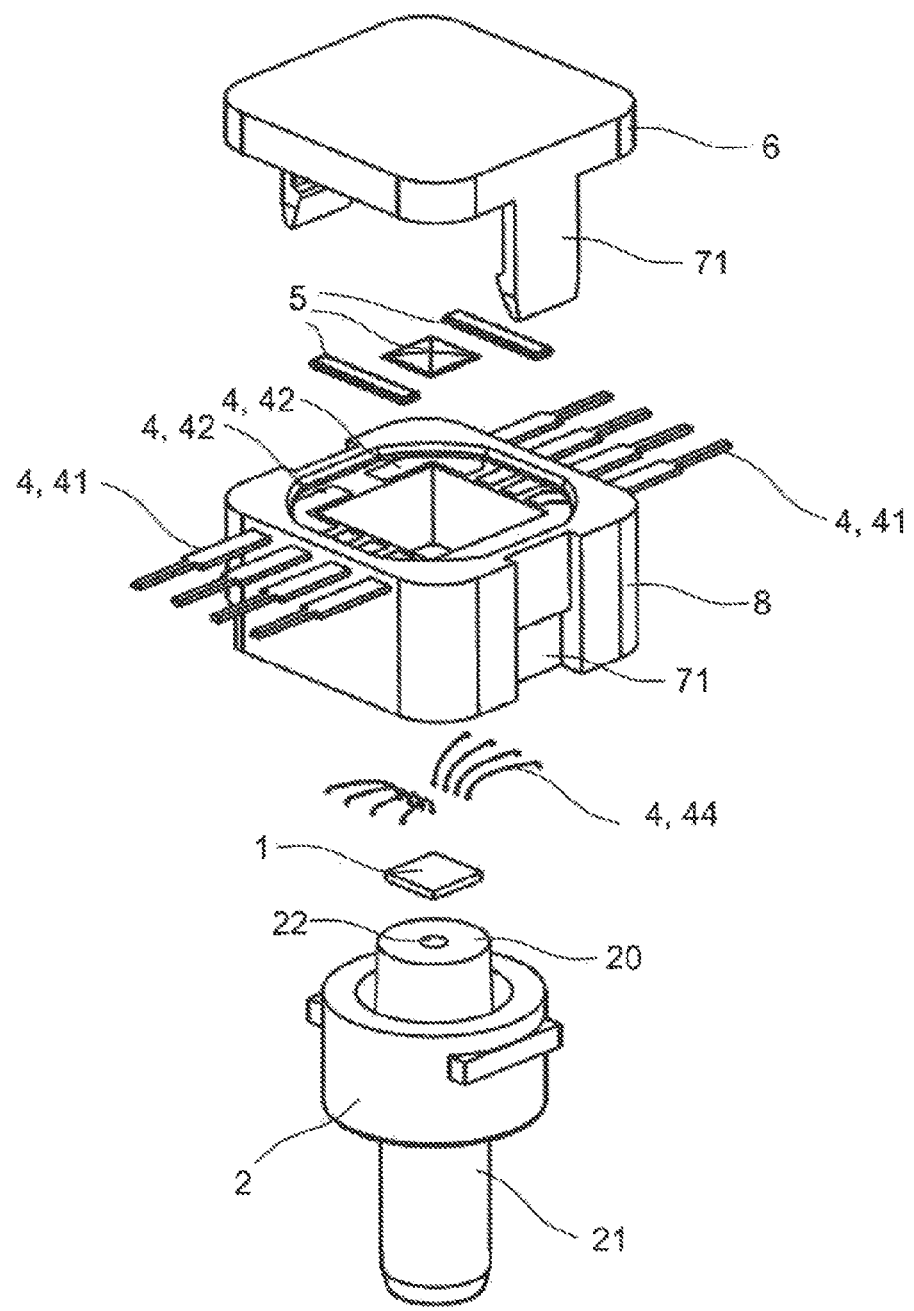

A further exemplary embodiment of a pressure sensor system, which represents a modification of the previous exemplary embodiment, is shown in conjunction with FIGS. 3A to 3F. FIGS. 3A and 3B again show views of the upper side and lower side of the pressure sensor system, while FIG. 3C is a sectional view through the pressure sensor system. FIG. 3D shows the pressure sensor system with open cover 6, while FIG. 3E shows a detail view of the open pressure sensor system with removed polymer potting 5. FIG. 3F shows an exploded view of the pressure sensor system.

In comparison to the previous exemplary embodiment, the pressure sensor system according to the exemplary embodiment of FIGS. 3A to 3F comprises a housing body 2 having a mounting receptacle 20, which are implemented as protrusions. On the mounting receptacle 20, a pressure sensor chip 1 is arranged, which is connected via bond wires 44 to conductor tracks 42, which are in turn connected to a wiring carrier 41 for the external contacting. To protect the bond connections on the chip 1 and the conductor tracks 42, these are each covered with a separate polymer potting 5.

In comparison to the previous exemplary embodiment, the wiring carrier 41 and the conductor tracks 42 are arranged on and also partially in a plastic housing 8, which is fastened on the housing body 2 by a mechanical lock or by gluing. The cover 6 is fastened using a mechanical lock 71 in the form of teeth on the plastic housing 8, which has corresponding recesses. Alternatively thereto, the cover 6, for example, can also be fastened by means of an adhesive on the plastic housing 8. The plastic housing 8 is used for holding the electrical connections 4, while the monolithically formed housing body 2, together with the directly mounted pressure sensor chip 1, forms the part of the pressure sensor system provided for the pressure measurement.

The exemplary embodiments of the pressure sensor system shown in the figures are not restricted to the features shown and can comprise further or alternative features according to the embodiments in the general part.

The invention is not restricted thereto by the description on the basis of the exemplary embodiments. Rather, the invention comprises every novel feature and every combination of features, which includes in particular every combination of features in the patent claims, even if this feature or this combination is not explicitly specified itself in the patent claims or exemplary embodiments.

What is claimed is:

1. A pressure sensor system comprising:
a pressure sensor chip mounted on a mounting receptacle of a housing body comprising a ceramic material, the housing body having a pressure fitting and a pressure feed guided to the pressure sensor chip, the pressure feed extending from the pressure fitting up to the pressure sensor chip,
wherein the housing body comprises a non-planar three-dimensional surface topography on a mounting side on which the sensor chip is mounted,
wherein the housing body is a monolithic structure such that the pressure fitting comprising the ceramic material and the pressure feed comprising the ceramic material are part of the monolithic structure, wherein a coefficient of thermal expansion of the housing body deviates by less than 30% from the coefficient of thermal expansion of the pressure sensor chip in a temperature range of greater than or equal to −40° C. and less than or equal to 150° C.,
wherein the pressure fitting is cylindrical or conical, wherein the pressure feed comprises a through opening in the housing body that extends from a first end to an opposite second end, wherein the second end of the through opening is an opening in the mounting receptacle, wherein a cross-sectional dimension of the through opening at the first end is larger than a cross-sectional dimension of the through opening at the second end, and
wherein the pressure feed, leading toward the pressure sensor chip, is undercut-free.

2. The pressure sensor system according to claim 1, wherein the pressure fitting has a round cross-section.

3. The pressure sensor system according to claim 1, wherein the pressure fitting has a groove on a side facing the pressure sensor, the groove surrounding the pressure feed.

4. The pressure sensor system according to claim 1, wherein the pressure sensor chip is based on silicon.

5. The pressure sensor system according to claim 1, wherein the ceramic material comprises mullite.

6. The pressure sensor system according to claim 1, wherein the ceramic material comprises aluminum oxide, zirconium oxide, aluminum nitride, silicon carbide, and/or silicon nitride.

7. The pressure sensor system according to claim 1, the ceramic material consists of one or more selected from mullite, aluminum nitride, silicon carbide, and/or silicon nitride.

8. The pressure sensor system according to claim 1, wherein the coefficients of thermal expansion of the housing body and the pressure sensor chip deviate by less than 10% from one another in a temperature range of greater than or equal to −50° C. and less than or equal to 200° C.

9. The pressure sensor system according to claim 1, wherein the mounting receptacle is formed by a protrusion or a depression of the housing body and the pressure feed opens into the mounting receptacle.

10. The pressure sensor system according to claim 1, wherein a signal processing chip is mounted on a further mounting receptacle of the housing body.

11. The pressure sensor system according to claim 1, wherein the pressure sensor chip is mounted by a rigid connecting material directly on the mounting receptacle formed by a glass solder, a metallic solder, or an epoxy resin adhesive.

12. The pressure sensor system according to claim 1, wherein the housing body is three-dimensionally shaped and monolithically formed by a ceramic injection molding method.

13. The pressure sensor system according to claim 1, wherein the pressure sensor system comprises electrical connections on the housing body for electrical connection of at least the pressure sensor chip, which comprise one or more of the following elements: wiring carrier, conductor tracks, and bond wires.

14. The pressure sensor system according to claim 1, wherein the pressure sensor chip is electrically contacted by bond wire connections covered with a polymer potting.

15. The pressure sensor system according to claim 1, wherein the pressure sensor system comprises a cover fastened on the housing body above the pressure sensor chip.

16. The pressure sensor system according to claim 15, wherein the cover is fastened on the housing body by a mechanical lock.

17. A method of forming a pressure sensor system, the method comprising:
providing a pressure sensor chip;
using a ceramic injection molding method, forming a housing body having a monolithical structure and comprising a non-planar three-dimensional surface topography on a mounting side; and
mounting the pressure sensor chip over the mounting side of the housing body, the housing body having a pressure fitting and a pressure feed guided to the pressure sensor chip such that the pressure fitting comprising a ceramic material and the pressure feed comprising the ceramic material are part of the monolithic structure, the pressure feed extending from the pressure fitting up to the pressure sensor chip, wherein the pressure fitting is cylindrical or conical, wherein the pressure feed comprises a through opening in the housing body that extends from a first end to an opposite second end, wherein the second end of the through opening is an opening in the mounting side, wherein a cross-sectional dimension of the through opening at the first end is larger than a cross-sectional dimension of the through opening at the second end, wherein the pressure feed, leading toward the pressure sensor chip, is undercut-free, and
wherein a coefficient of thermal expansion of the housing body deviates by less than 30% from the coefficient of thermal expansion of the pressure sensor chip in a temperature range of greater than or equal to −40° C. and less than or equal to 150° C.

18. The method of claim 17, wherein forming the housing body comprises sintering at 1500° C. to 1750° C. in air.

19. The method of claim 17, wherein forming the housing body comprises fixing a cover on the housing body above the sensor chip.

20. The method of claim 19, wherein the cover is fastened on the housing by a mechanical lock.

21. A pressure sensor system comprising:
a pressure sensor chip mounted on a mounting receptacle of a housing body comprising a ceramic material, the housing body having a pressure fitting and a pressure feed guided to the pressure sensor chip such that the pressure fitting comprising the ceramic material and the pressure feed comprising the ceramic material are part of a monolithic structure, the pressure feed extending from the pressure fitting up to the pressure sensor chip, wherein the mounting receptacle comprises a depression in the housing body, wherein the pressure feed comprises a through opening in the housing body that extends from a first end to an opposite second end, wherein the second end of the through opening is an opening in the mounting receptacle, wherein a cross-sectional dimension of the through opening at the first end is larger than a cross-sectional dimension of the through opening at the second end, wherein the through opening comprises a first section comprising parallel sidewall and a second section comprising tapered sidewalls, wherein the second section comprises a first cross-sectional dimension at an end towards the first end and a second cross-sectional dimension at an opposite end towards the second end, wherein the second cross-sectional dimension is smaller than the first cross-sectional dimension.

\* \* \* \* \*